(12) United States Patent
Li et al.

(10) Patent No.: US 12,252,641 B2
(45) Date of Patent: Mar. 18, 2025

(54) PREPARATION METHOD FOR NARROW-LINEWIDTH ALLOY QUANTUM DOT

(71) Applicant: Lingnan Normal University, Zhanjiang (CN)

(72) Inventors: Qinghua Li, Zhanjiang (CN); Lingfeng Wang, Zhanjiang (CN); Xuping Liu, Zhanjiang (CN); Xiao Jin, Zhanjiang (CN); Dongyu Li, Zhanjiang (CN); Deng Wang, Zhanjiang (CN); Jingke Bai, Zhanjiang (CN); Bing Xu, Zhanjiang (CN)

(73) Assignee: Lingnan Normal University (CN)

( * ) Notice: Subject to any disclaimer, the term of this patent is extended or adjusted under 35 U.S.C. 154(b) by 82 days.

(21) Appl. No.: 18/128,726

(22) Filed: Mar. 30, 2023

(65) Prior Publication Data
US 2024/0110095 A1   Apr. 4, 2024

(30) Foreign Application Priority Data

Sep. 29, 2022   (CN) .......................... 202211202913.2

(51) Int. Cl.
| | |
|---|---|
| *C09K 11/88* | (2006.01) |
| *B82Y 20/00* | (2011.01) |
| *B82Y 30/00* | (2011.01) |
| *B82Y 40/00* | (2011.01) |
| *C09K 11/02* | (2006.01) |
| *H10K 50/115* | (2023.01) |

(52) U.S. Cl.
CPC ............ *C09K 11/883* (2013.01); *C09K 11/02* (2013.01); *H10K 50/115* (2023.02); *B82Y 20/00* (2013.01); *B82Y 30/00* (2013.01); *B82Y 40/00* (2013.01)

(58) Field of Classification Search
CPC ........ C09K 11/883; B82Y 20/00; B82Y 40/00
See application file for complete search history.

(56) References Cited

FOREIGN PATENT DOCUMENTS

CN   115477945 B   12/2022

OTHER PUBLICATIONS

Chinese Office Action issued in co-pending application No. 202211202913.2, dated Aug. 18, 2023.
Xiao Jin, "Thick-shell CdZnSe/ZnSe/ZnS quantum dots for bright white light-emitting diodes", Journal of Luminescence, pp. 1-10, published Oct. 2020.
Chinese Office Action issued in co-pending application No. 202211202913.2, dated Nov. 28, 2023.

*Primary Examiner* — C Melissa Koslow
(74) *Attorney, Agent, or Firm* — Whiteford, Taylor & Preston, LLP; Peter J. Davis (57) ABSTRACT

The present disclosure belongs to the technical field of nanomaterial synthesis, and in particular, to a preparation method for a core-shell structure quantum dot. The preparation method provided by the present disclosure includes the following steps: in a protective gas atmosphere, mixing a cadmium source, an organic ligand, and an organic solvent with a first selenium source for a nucleation reaction to obtain an organic solution of a CdSe quantum dot core; and mixing the organic solution of the CdSe quantum dot core, a zinc source and an inorganic anion source for shell coating to obtain the core-shell structure quantum dot, where the inorganic anion source includes a second selenium source.

1 Claim, 4 Drawing Sheets

PREPARATION METHOD FOR NARROW-LINEWIDTH ALLOY QUANTUM DOT

CROSS REFERENCE TO RELATED APPLICATION

This patent application claims the benefit and priority of Chinese Patent Application No. 202211202913.2, filed with the China National Intellectual Property Administration on Sep. 29, 2022, the disclosure of which is incorporated by reference herein in its entirety as part of the present application.

TECHNICAL FIELD

The present disclosure belongs to the technical field of nanomaterial synthesis, and in particular, to a preparation method for a core-shell structure quantum dot.

BACKGROUND

Compared with traditional fluorescent materials, quantum dots are widely used in the fields of light-emitting diodes, solar cells, catalysis and biomedical imaging due to their adjustable luminescence wavelength, narrow emission peak width, high quantum yield and excellent stability.

At present, display products based on quantum dots are found in the market. The light-emitting diode with quantum dots as the light-emitting layer is developing rapidly, and is expected to replace the current organic light-emitting semiconductor (OLED) as the next generation of display products. However, for an ideal display, the emission half-peak width of the three primary colors shall be in the range of about 10 nm. However, current quantum dot materials do not support this range.

At present, the emission half-peak width of traditional quantum dots is generally in the range of 25-30 nm, and the narrower emission half-peak width is more than 20 nm. The wide linewidth limits the application of quantum dots in the field of display devices which require high luminescence performance. In particular, long-band luminous (about 550 nm) quantum dots, such as cadmium selenide-based quantum dot materials, have a naturally wider half-peak width in nanometers at the same linewidth level due to low light energy.

SUMMARY

An objective of the present disclosure is to provide a preparation method for a core-shell structure quantum dot, so as to reduce an emission peak width of the quantum dot. The peak width of the core-shell structure quantum dot provided by the present disclosure is less than 20 nm, and the narrowest half-peak width can reach 15 nm.

The preparation method provided by the present disclosure conducts nucleation and growth of a quantum dot core in an organic solvent by an oil phase method to obtain a CdSe quantum dot core, and conducts shell coating. In the process of shell coating, secondary growth of the CdSe quantum dot core is promoted, and the CdSe quantum dot core with small size grows preferentially due to the higher surface energy during the secondary growth, thus improving the size dispersion uniformity of the quantum dot core. In addition, the size of the quantum dot core is further increased while the monodispersion of quantum dot particles is improved. A large quantum dot size can significantly weaken the exciton-phonon coupling and ensure that the emission linewidth of the quantum dot is at a narrow level. In addition, the present disclosure uses cadmium ions in the CdSe quantum dot core and zinc ions in the zinc source to conduct cation exchange at the coating interface during shell coating of the zinc source and the inorganic anion source, so as to realize zinc doping in the CdSe quantum dot core and cadmium doping in the shell, thus reducing the lattice stress of the core-shell structure quantum dot. The fluorescence band blue of the quantum dot can be further shifted to orange and green bands, and the emission linewidth of the quantum dot can be compressed, so as to inhibit the non-uniform broadening and intrinsic broadening of emission of the quantum dot. The preparation method provided by the present disclosure can stably obtain the quantum dot of ultra-high color purity, providing a more excellent choice for research and application of high-quality display, quantum dot laser and multi-channel biomedical labeling imaging in the next generation.

Furthermore, the preparation method provided by the present disclosure introduces sulfur during shell coating, and the shell formed can further passivate defects on the surface of the quantum dot and improve optical stability of the quantum dot. Thus, the preparation method provided by the present disclosure can inhibit the broadening of the emission linewidth from multiple angles, and finally achieve ultra-narrow emission linewidth that cannot be achieved by the traditional preparation method.

Further, the preparation method provided by the present disclosure conducts first shell coating on the surface of the CdSe quantum dot core to obtain a ZnSe shell and second shell coating to obtain a ZnS shell. The coating of two layers of shell can further increase the size of quantum dot products, and inhibit the broadening of the emission linewidth at three structural levels of the quantum dot core, the first shell (ZnSe shell) and the second shell (ZnS shell), achieving ultra-narrow emission linewidth that cannot be achieved by the traditional preparation method.

DETAILED DESCRIPTION OF THE EMBODIMENTS

The present disclosure provides a preparation method for a core-shell structure quantum dot, including the following steps.

In a protective gas atmosphere, a cadmium source, an organic ligand, and an organic solvent are mixed with a first selenium source for a nucleation reaction to obtain an organic solution of a CdSe quantum dot core.

The organic solution of the CdSe quantum dot core, a zinc source and an inorganic anion source are mixed for shell coating to obtain the core-shell structure quantum dot. The inorganic anion source includes a second selenium source.

In the present disclosure, unless otherwise specified, all raw materials/compositions for preparation are commercially available products well known to those skilled in the art.

In the present disclosure, in a protective gas atmosphere, a cadmium source, an organic ligand, and an organic solvent (hereinafter referred to as the first organic solvent) are mixed (hereinafter referred to as the first mixing) with a first selenium source for a nucleation reaction to obtain an organic solution of a CdSe quantum dot core.

In the present disclosure, the cadmium source includes one or more selected from the group consisting of cadmium oxide, cadmium acetate, cadmium iodide, cadmium bromide and cadmium chloride, more preferably, including one or more selected from the group consisting of cadmium acetate, cadmium iodide, and cadmium oxide.

In the present disclosure, the cadmium source is preferably subjected to the first mixing in the form of a cadmium precursor.

In the present disclosure, a preparation method for the cadmium precursor preferably includes the following steps.

In a protective gas atmosphere, the cadmium source is heated and dissolved in a second organic solvent and a first organic acid dissolver to obtain the cadmium precursor. In the present disclosure, the second organic solvent preferably includes one or more selected from the group consisting of 1-octadecene, 1-dodecene, squalene, dodecane, hexadecane, octadecane, docosane, oleylamine, octadecylamine, hexadecylamine, octylamine and trioctylphosphine oxide, preferably one or more selected from the group consisting of 1-octadecene, squalene and octadecane. In the present disclosure, the first organic acid dissolver preferably includes one or more selected from the group consisting of lauric acid, myristic acid, palmitic acid, stearic acid, oleic acid, linoleic acid, trans-oleic acid and trans-linoleic acid, preferably one or more selected from the group consisting of oleic acid, palmitic acid and stearic acid. In the present disclosure, the cadmium source, the second organic solvent and the first organic acid dissolver are at a molar ratio of preferably (1-2):(10-20):(4-10), more preferably 1:10:3. In the present disclosure, the heating dissolution is conducted at 150-200° C., more preferably 160-190° C., and further preferably 170-180° C. The present disclosure has no special requirements for the time of heating dissolution, as long as the cadmium source is dissolved until clarified. In the present disclosure, the cadmium precursor is preferably prepared in an inert gas atmosphere of a Schlenk device connected with nitrogen.

In the present disclosure, the organic ligand preferably includes oleic acid and/or oleylamine, more preferably oleic acid.

In the present disclosure, when the organic ligand is preferably oleylamine and the cadmium source is preferably cadmium oxide, the cadmium source is preferably subjected to the first mixing in the form of the cadmium precursor.

In the present disclosure, a molar ratio of cadmium in the organic ligand and the cadmium source is preferably (3-7):1, more preferably (4-6):1, and further preferably 5:1.

In the present disclosure, the first organic solvent preferably includes one or more selected from the group consisting of 1-octadecene, 1-dodecene, squalene, dodecane, hexadecane, octadecane, docosane, oleylamine, octadecylamine, hexadecylamine, and trioctylphosphine oxide, preferably one or more selected from the group consisting of 1-octadecene, 1-dodecene, and squalene.

The present disclosure has no special requirements for the amount of the first organic solvent, as long as the nucleation reaction is conducted smoothly.

In the present disclosure, the first selenium source preferably includes one or more selected from the group consisting of a selenium elemental substance, selenium dioxide, and selenium urea. In the present disclosure, the selenium elemental substance is specifically preferably selenium powder.

In the present disclosure, the first selenium source is preferably subjected to the first mixing in the form of a first selenium precursor.

In the present disclosure, a preparation method for the first selenium precursor preferably includes the following steps.

In a protective gas atmosphere, the first selenium source is dissolved in a third organic solvent and a first organic phosphine dissolver to obtain the first selenium precursor. In the present disclosure, the third organic solvent preferably includes one or more selected from the group consisting of 1-octadecene, 1-dodecene, squalene, dodecane, hexadecane, octadecane, docosane, oleylamine, octadecylamine, hexadecylamine, octylamine and trioctylphosphine oxide. In the present disclosure, the first organic phosphine dissolver preferably includes one or more selected from the group consisting of triethylphosphine, tributyl phosphine, tri-n-octylphosphine and diphenyl phosphine, more preferably tri-n-octylphosphine. In the present disclosure, the first selenium source, the third organic solvent, and the first organic phosphine dissolver are at a molar ratio of preferably (1-2):(5-10):(4-6), more preferably 1:10:4. In the present disclosure, in the protective gas atmosphere, $H_2O$ is preferably less than or equal to 0.1 ppm, and $O_2$ is preferably less than or equal to 0.1 ppm. In the present disclosure, the dissolution is preferably conducted under the condition of ultrasound, and the present disclosure has no special requirements for the specific implementation process of the ultrasound treatment. The present disclosure has no special requirements for the time of dissolution, as long as the first selenium source is dissolved until clarified.

In the present disclosure, the cadmium source and the first selenium source are at a molar ratio of preferably (2-4):1, more preferably (2-3):1, and further preferably 2.5:1.

In the present disclosure, the sequence of the first mixing is preferably to mix the cadmium source, the organic ligand, and the first organic solvent with the first selenium source in sequence.

In the present disclosure, the nucleation reaction is conducted in a protective gas atmosphere. In the present disclosure, the protective gas preferably includes nitrogen and/or argon, more preferably nitrogen. In the present disclosure, in the protective gas atmosphere, $H_2O$ is preferably less than or equal to 0.1 ppm, and $O_2$ is preferably less than or equal to 0.1 ppm.

As a specific example of the present disclosure, the device for nucleation reaction is constructed on a Schlenk line. Before the first mixing and the nucleation reaction, the present disclosure preferably connects a vacuum pump to pump the air in the reaction system at 120° C. for 6 h, blows the protective gas, such as argon or nitrogen, into the reaction bottle of the nucleation reaction, and exhausts for 1 h to ensure an oxygen-free environment. In the present disclosure, the nucleation reaction is conducted in a protective gas atmosphere. The present disclosure strictly controls the content of free acid in the nucleation reaction process, and reduces the free acid contained in the system during the nucleation, which is conducive to the synthesis of the narrow-linewidth quantum dot. In addition, in the present disclosure, the nucleation reaction environment is preferably deoxygenated, and the specific operation of the deoxygenation is preferably as follows: the reaction device of the nucleation reaction is connected with the vacuum pump to pump the air in the reaction system at 120° C. for 6 h, the protective gas, such as argon or nitrogen, is pumped into the reaction bottle of the nucleation reaction, and the gas is exhausted for 1 h to ensure an oxygen-free environment. The present disclosure preferably prepares a quantum dot product with a narrow emission linewidth by deoxygenation.

In the present disclosure, the nucleation reaction is conducted at preferably 220-320° C., more preferably 280-320° C., and further preferably 290-310° C. In the present disclosure, the nucleation reaction is conducted for preferably 10-40 min, more preferably 20-30 min, and further preferably 25 min.

The present disclosure preferably conducts the nucleation reaction at 220-320° C., which can promote the growth of quantum dot and obtain a large-size quantum dot core. In addition, the high-quality quantum dot with fewer crystal defects can be obtained by the nucleation reaction at 220-320° C.

After the organic solution of the CdSe quantum dot core is obtained, the present disclosure mixes (hereinafter referred to as the second mixing) the organic solution of the CdSe quantum dot core, a zinc source and an inorganic anion source for shell coating to obtain the core-shell structure quantum dot. The inorganic anion source includes a second selenium source.

In the present disclosure, the zinc source preferably includes one or more selected from the group consisting of zinc oxide, zinc didocosanoate, zinc caprylate, zinc myristate, zinc acetate, zinc carbonate hydroxide hydrate, zinc carbonate, zinc hydroxide, zinc chloride, zinc bromide, zinc iodide and zinc granules, more preferably one or more selected from the group consisting of zinc didocosanoate, zinc caprylate, zinc myristate, zinc acetate, zinc carbonate, and zinc bromide.

In the present disclosure, the zinc source is preferably subjected to the second mixing in the form of a zinc precursor.

In the present disclosure, a preparation method for the zinc precursor preferably includes the following steps.

The zinc source is heated and dissolved in a second organic acid dissolver to obtain an organic acid solution of the zinc source. After solid-liquid separation of the organic acid solution of the zinc source, a solid phase product is dried to obtain the zinc precursor. In the present disclosure, the second organic acid dissolver preferably includes one or more selected from the group consisting of hexanoic acid, octanoic acid, decanoic acid, lauric acid, myristic acid, palmitic acid, linoleic acid, trans-linoleic acid, stearic acid, oleic acid, trans-oleic acid, erucic acid, docosanoic acid, benzoic acid, phenylacetic acid, phenylpropionic acid, phenylbutyric acid, octadecyl sulfonic acid, dodecylsulfonic acid, hexanesulfonic acid, octadecyl phosphoric acid, dodecyl phosphoric acid, and hexyl phosphoric acid, more preferably one or more selected from the group consisting of stearic acid, oleic acid, benzoic acid, and phenylacetic acid. In the present disclosure, the zinc source and the second organic acid dissolver are at a molar ratio of preferably 1:2. In the present disclosure, the heating dissolution is conducted at preferably 180-250° C., more preferably 200-220° C., and further preferably 210° C. In the present disclosure, the solid-liquid separation is preferably conducted by suction filtration. The present disclosure has no special requirements for the specific implementation process of drying.

As a specific example of the present disclosure, the present disclosure preferably adjusts the zinc source or part of the zinc source for the second mixing to the raw material for the first mixing, that is, adding all or part of the zinc source for the second mixing during the first mixing, and the second mixing omits the addition of all or part of the zinc source. In the present disclosure, when the zinc source or part of the zinc source is used as the raw material for the first mixing, the zinc source or part of the zinc source is preferably subjected to the first mixing in the form of a zinc precursor. In the present disclosure, when the zinc source or part of the zinc source is used as the raw material for the first mixing, the zinc source or part of the zinc source does not participate in the nucleation reaction.

In the present disclosure, the type of the second selenium source is preferably the same as that of the first selenium source, which will not be repeated here.

In the present disclosure, the second selenium source is preferably subjected to the second mixing in the form of a second selenium precursor.

In the present disclosure, a preparation method for the second selenium precursor is preferably the same as that for the first selenium precursor, which will not be repeated here.

In the present disclosure, the second selenium precursor has a molar concentration of preferably 0.1-1.5 mol/L, more preferably 0.5-1.0 mol/L, and further preferably 0.8 mol/L.

In the present disclosure, the inorganic anion source further preferably includes a sulfur source.

In the present disclosure, the sulfur source preferably includes one or more selected from the group consisting of sulfur powder, octyl mercaptan, dodecanethiol, and thiourea.

In the present disclosure, the sulfur source is preferably subjected to the second mixing in the form of a sulfur precursor.

In the present disclosure, a preparation method for the sulfur precursor preferably includes the following steps.

In a protective gas atmosphere, the sulfur source is dissolved in a fourth organic solvent and a second organic phosphine dissolver to obtain the sulfur precursor. In the present disclosure, the fourth organic solvent preferably includes one or more selected from the group consisting of 1-octadecene, 1-dodecene, squalene, dodecane, hexadecane, octadecane, docosane, oleylamine, octadecylamine, hexadecylamine, octylamine and trioctylphosphine oxide. The second organic phosphine dissolver preferably includes one or more selected from the group consisting of triethylphosphine, tributyl phosphine, tri-n-octylphosphine and diphenyl phosphine In the present disclosure, the sulfur source, the fourth organic solvent, and the second organic phosphine dissolver are at a molar ratio of preferably (1-2):(5-10):(4-6), more preferably 1:10:4. In the present disclosure, in the protective gas atmosphere, $H_2O$ is preferably less than or equal to 0.1 ppm, and $O_2$ is preferably less than or equal to 0.1 ppm. In the present disclosure, the dissolution is preferably conducted under the condition of ultrasound, and the present disclosure has no special requirements for the specific implementation process of the ultrasound treatment. The present disclosure has no special requirements for the time of dissolution, as long as the first selenium source is dissolved until clarified.

In the present disclosure, the sulfur precursor has a molar concentration of preferably 0.1-1.5 mol/L, more preferably 0.5-1.0 mol/L, and further preferably 0.8 mol/L.

As a specific example of the present disclosure, a process of conducting the second mixing for shell coating preferably includes the following steps: the inorganic anion source is dropwise added to a mixed solution formed by the organic solution of the CdSe quantum dot core and the zinc source for the second mixing for shell coating to obtain the core-shell structure quantum dot. In the present disclosure, the inorganic anion source is dropwise added at preferably 1-3 mL/h. In the present disclosure, when the inorganic anion source preferably includes the second selenium source and the sulfur source, the second selenium source is preferably dropwise added in the form of the second selenium precursor, and the second selenium precursor is dropwise added at preferably 1 mL/h. The sulfur source is preferably dropwise added in the form of the sulfur precursor. The sulfur precursor is dropwise added at preferably 3 mL/h.

In the present disclosure, the shell coating is conducted at preferably 220-320° C., more preferably 280-320° C., and further preferably 290-310° C.

As a specific example of the present disclosure, a process of conducting the second mixing for shell coating preferably includes the following steps.

The organic solution of the CdSe quantum dot core, partial zinc source and the second selenium source are mixed for first shell coating to obtain an organic solution with an inner shell coating the quantum dot core.

The organic solution with the inner shell coating the quantum dot core, residual zinc source, and the sulfur source are mixed for second shell coating, so as to obtain the core-shell structure quantum dot.

The present disclosure mixes (hereinafter referred to as the third mixing) the organic solution of the CdSe quantum dot core, the partial zinc source and the second selenium source for first shell coating to obtain an organic solution with an inner shell coating the quantum dot core.

In the present disclosure, the partial zinc source is preferably subjected to the third mixing in the form of a partial zinc precursor.

As a specific example of the present disclosure, the partial zinc source is added during the first mixing, instead of the third mixing.

In the present disclosure, the partial zinc source, the cadmium source and the first selenium source are at a molar ratio of (10-20):(2-4): 1, more preferably (14-18):(2-3): 1, and further preferably 16:2.5:1.

In the present disclosure, the cadmium source and the second selenium source are at a molar ratio of preferably 2:3.

In the present disclosure, the third mixing is preferably as follows: the second selenium source is dropwise added to the mixed solution formed by the organic solution of the CdSe quantum dot core and the partial zinc source. The second selenium source is preferably dropwise added in the form of a second selenium precursor. The second selenium precursor has a molar concentration of preferably 0.1-1.5 mol/L, more preferably 0.5-1.0 mol/L, and further preferably 0.8 mol/L. The second selenium precursor is dropwise added at preferably 1 mL/h. In the present disclosure, after the second selenium precursor is dropwise added, the present disclosure preferably continues to conduct thermal insulation coating for 30 min.

The present disclosure preferably adjust the lattice stress between the core-shell materials to an appropriate degree by adjusting the dropwise-adding rate of the second selenium precursor to 1 mL/h and using the ion exchange reaction between zinc ions and cadmium ions during the shell coating. If the shell grows too fast, it will hinder the ion exchange.

In the present disclosure, the first shell coating is conducted at preferably 220-320° C., more preferably 280-320° C., and further preferably 290-310° C.

After the organic solution with the inner shell coating the quantum dot core is obtained, the present disclosure mixes (hereinafter referred to as the fourth mixing) the organic solution with the inner shell coating the quantum dot core, the residual zinc source, and the sulfur source for second shell coating, so as to obtain the core-shell structure quantum dot.

In the present disclosure, the residual zinc source is preferably subjected to the fourth mixing in the form of a residual zinc precursor.

In the present disclosure, the residual zinc source and the second selenium source are at a molar ratio of preferably 1:1, and the sulfur source and the residual zinc source are at a molar ratio of preferably 3:1.

In the present disclosure, the fourth mixing preferably includes the following steps: the organic solution with the inner shell coating the quantum dot core and the residual zinc source are nixed to obtain a mixed solution. After the mixed solution is held for 10 min, the sulfur source is dropwise added to the mixed solution. In the present disclosure, the sulfur source is preferably dropwise added in the form of the sulfur precursor. The sulfur precursor has a molar concentration of preferably 0.1-1.5 mol/L, more preferably 0.5-1.0 mol/L, and further preferably 0.8 mol/L. The sulfur precursor is dropwise added at 3 mL/h. In the present disclosure, after the sulfur precursor is dropwise added, the present disclosure preferably continues to conduct thermal insulation coating for 30 min.

In the present disclosure, the second shell coating is conducted at preferably 220-320° C., more preferably 280-320° C., and further preferably 290-310° C.

In the present disclosure, after the shell coating, the coating solution is obtained. The present disclosure preferably post-processes the coating solution to obtain the core-shell structure quantum dot. In the present disclosure, the post-processing preferably includes the following steps: the coating solution is cooled and mixed with a mixed solvent of n-hexane and methanol for mixed purification to obtain a purified coating solution. After the solvent is removed, the purified coating solution is mixed with acetone, and the core-shell structure quantum dot is obtained by solid-liquid separation. In the present disclosure, the mixed purification is specifically preferably as follows: the coating solution is cooled, mixed with a mixed solvent of n-hexane and methanol and subjected to still standing for layering. After cooling, the coating solution is at preferably 40-80° C., more preferably 50-70° C., and further preferably 60° C. The n-hexane and the methanol has a volume ratio of (1-2):(1-3), more preferably 1:2. The stirring for mixing is conducted for preferably 5 min. The still standing for layering is conducted for preferably 5 min. The mixed purification is conducted for preferably 5 times. The method for removing the solvent from the purified coating solution is selected as blowing the solvent in the purified coating solution with argon, and the solvent is preferably n-hexane and residual methanol. In the present disclosure, the solid-liquid separation is preferably conducted by centrifugation.

The present disclosure provides a core-shell structure quantum dot prepared by the preparation method according to the above technical solutions, including a quantum dot core and a shell coating a surface of the quantum dot core. A chemical composition of the quantum dot core includes CdSe and zinc doped CdSe. A chemical composition of the shell includes cadmium doped ZnSe and ZnSe.

In the present disclosure, the core-shell structure quantum dot has a particle size greater than or equal to 10 nm, more preferably 10-20 nm.

As a specific example of the present disclosure, the chemical composition of the shell includes cadmium doped ZnSe ($Cd_xZn_{1-x}Se$) and ZnSe, or the chemical composition of the shell includes cadmium doped $ZnSe_xS_{1-x}$ and $ZnSe_xS_{1-x}$, or the shell includes an inner shell and an outer shell arranged in layers, and a chemical composition of the inner shell includes cadmium doped ZnSe and ZnSe. A chemical composition of the outer shell includes ZnS. Or, the shell includes an inner shell and an outer shell arranged in layers, and a chemical composition of the inner shell includes cadmium doped $ZnSe_xS_{1-x}$ and $ZnSe_xS_{1-x}$. A chemical composition of the outer shell includes ZnS.

In order to further illustrate the present disclosure, the technical solutions provided by the present disclosure are described in detail below in connection with accompanying drawings and examples, but these examples should not be understood as limiting the claimed scope of the present disclosure.

Example 1

1) Zinc acetate and oleic acid were mixed with a molar ratio of 1:2 at 200° C. until they were completely dissolved, and suction filtration was conducted to extract powder obtained after a solid phase product was dried. The powder was dissolved in 1-octadecene, which was a zinc precursor, with a molar concentration of 0.3 mol/L.

Cadmium oxide, 1-octadecene and oleic acid were mixed with a molar ratio of 1:10:4 at 200° C. until clarified to obtain a cadmium precursor.

Selenium powder was dissolved in 1-octadecene and tri-n-octylphosphine. The selenium powder, the 1-octadecene and the tri-n-octylphosphine had a molar ratio of 1:10:4, and the selenium precursor was obtained by ultrasonic vibration dissolution in a protective atmosphere.

In a glove box, sulfur powder was dissolved in 1-octadecene and tri-n-octylphosphine. The sulfur powder, the 1-octadecene and the tri-n-octylphosphine had a molar ratio of 1:10:4, and the sulfur precursor was obtained by ultrasonic vibration dissolution in a protective atmosphere.

2) A first amount of the zinc precursor, the cadmium precursor, oleic acid as an organic ligand and 1-octadecene as an organic solvent were injected into a first amount of the selenium precursor in a nitrogen atmosphere at 300° C. to induce a nucleation reaction and obtain a 1-octadecene solution with a cadmium selenide core. A molar ratio of the first amount of the zinc precursor measured by zinc acetate, the cadmium precursor measured by cadmium oxide, and the first amount of the selenium precursor measured by selenium powder was 16:2.5:1, and a molar ratio of cadmium ions in the oleic acid and the cadmium oxide was 5:1.

3) Coating was conducted with the zinc selenide layer (inner shell): a second amount of the selenium precursor was injected into a reaction device containing the 1-octadecene solution with a cadmium selenide core at 1 mL/h through an injection pump, and heat preservation was conducted for 30 min after injection. Coating was conducted with the zinc sulfide layer (outer shell): a second amount of the zinc precursor (1-octadecene solution with a concentration of 0.3 M) was continued to be injected into the reaction device. A molar ratio of the second amount of the zinc precursor (measured by zinc acetate) to the inner shell selenium precursor (measured by selenium powder) was 1:1. After holding for 10 min, the sulfur precursor was dropwise added at 3 mL/h. A molar ratio of the sulfur precursor (measured by sulfur powder) to the injected zinc precursor (measured by zinc acetate) of the outer shell was 3:1. Heat preservation was conducted for 30 min after injection. A molar ratio of selenium to zinc in the chemical composition of the zinc selenide layer was 1:1. A molar ratio of selenium to sulfur in the chemical composition of the zinc sulfide layer was 1:1. A molar ratio of the cadmium precursor in step 2) measured by cadmium oxide and the second amount of the selenium precursor in step 3) measured by selenium powder was 2:3.

4) After the quantum dot solution obtained in step 3) was cooled to 50° C., n-hexane and methanol with a volume ratio of 1:2 were added into the reaction system of quantum dot solution in step 3), stirred vigorously for 5 min, and subjected to still standing for 5 min for layering, and the methanol phase was sucked out. After the above operations were repeated for 5 times, argon was blown in to blow away the residual n-hexane and methanol. Finally, acetone was added. The precipitates obtained by centrifugation were the core-shell structure quantum dots.

Figure 1:
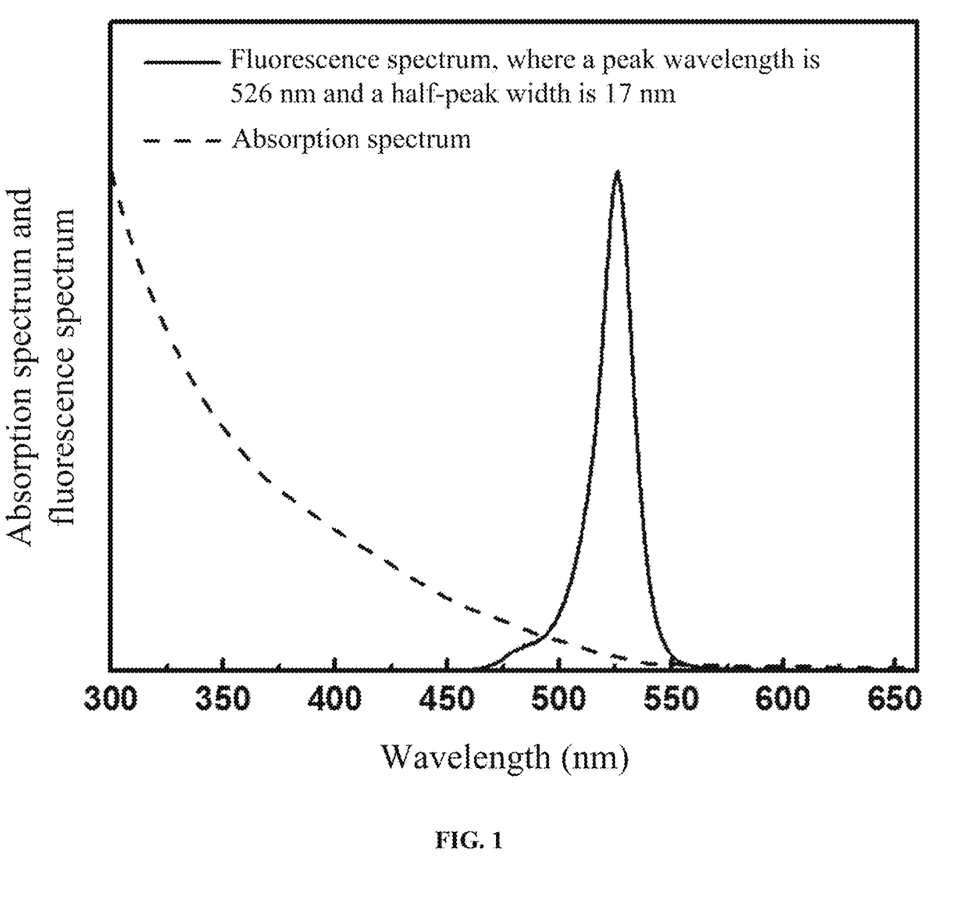
FIG. 1 shows an ultraviolet-visible absorption spectrum and photoluminescence spectrum diagram of a synthetic quantum dot in Example 1.

In this example, the core-shell structure quantum dots obtained were green light quantum dots with narrow emission linewidth, narrow emission half-peak width and high color purity. FIG. 1 shows an absorption spectrum and emission spectrum of a core-shell structure quantum dot synthesized in this example. Its luminescence wavelength is 526 nm in the green light band, and the narrowest emission half-peak width is 17 nm.

Example 2

1) Zinc acetate and docosanoic acid were mixed with a molar ratio of 1:2 at 250° C. until they were completely dissolved, and suction filtration was conducted to extract powder obtained after a solid phase product was dried. The powder was dissolved in 1-octadecene, which was a zinc precursor, with a molar concentration of 0.3 mol/L.

Cadmium oxide, 1-octadecene and oleic acid were mixed with a molar ratio of 1:15:4 at 200° C. until clarified to obtain a cadmium precursor.

Selenium powder was dissolved in 1-octadecene and tri-n-octylphosphine. The selenium powder, the 1-octadecene and the tri-n-octylphosphine had a molar ratio of 1:10:4, and the selenium precursor was obtained by ultrasonic vibration dissolution in a protective atmosphere.

In a glove box, sulfur powder was dissolved in 1-octadecene and tri-n-octylphosphine. The sulfur powder, the 1-octadecene and the tri-n-octylphosphine had a molar ratio of 1:10:4, and the sulfur precursor was obtained by ultrasonic vibration dissolution in a protective atmosphere.

2) A first amount of the zinc precursor, the cadmium precursor, oleic acid as an organic ligand and 1-octadecene as an organic solvent were injected into a first amount of the selenium precursor in a nitrogen atmosphere at 300° C. to induce a nucleation reaction and obtain a 1-octadecene solution with a cadmium selenide core. A molar ratio of the first amount of the zinc precursor measured by zinc acetate, the cadmium precursor measured by cadmium oxide, and the first amount of the selenium precursor measured by selenium powder was 16:3:1, and a molar ratio of cadmium ions in the oleic acid and the cadmium oxide was 5:1.

3) Coating was conducted with the zinc selenide layer (inner shell): a second amount of the selenium precursor was injected into a reaction device containing the 1-octadecene solution with a cadmium selenide core at 2 mL/h through an injection pump, and heat preservation was conducted for 30 min after injection. Coating was conducted with the zinc sulfide layer (outer shell): a second amount of the zinc precursor (1-octadecene solution with a concentration of 0.3

M) was continued to be injected into the reaction device. A molar ratio of the second amount of the zinc precursor (measured by zinc acetate) to the inner shell selenium precursor (measured by selenium powder) was 1:1. After holding for 10 min, 1 mmol of the sulfur precursor was dropwise added at 3 mL/h. A molar ratio of the sulfur precursor (measured by sulfur powder) to the injected zinc precursor (measured by zinc acetate) of the outer shell was 3:1. Heat preservation was conducted for 30 min after injection. A molar ratio of selenium to zinc in the chemical composition of the zinc selenide layer was 1:1. A molar ratio of selenium to sulfur in the chemical composition of the zinc sulfide layer was 1:1. A molar ratio of the cadmium precursor in step 2) measured by cadmium oxide and the second amount of the selenium precursor in step 3) measured by selenium powder was 2:3.

4) After the quantum dot solution obtained in step 3) was cooled to 50° C., n-hexane and methanol with a volume ratio of 1:2 were added into the reaction system of quantum dot solution in step 3), stirred vigorously for 5 min, and subjected to still standing for 5 min for layering, and the methanol phase was sucked out. After the above operations were repeated for 5 times, argon was blown in to blow away the residual n-hexane and methanol. Finally, acetone was added. The precipitates obtained by centrifugation were the core-shell structure quantum dots.

Figure 2:
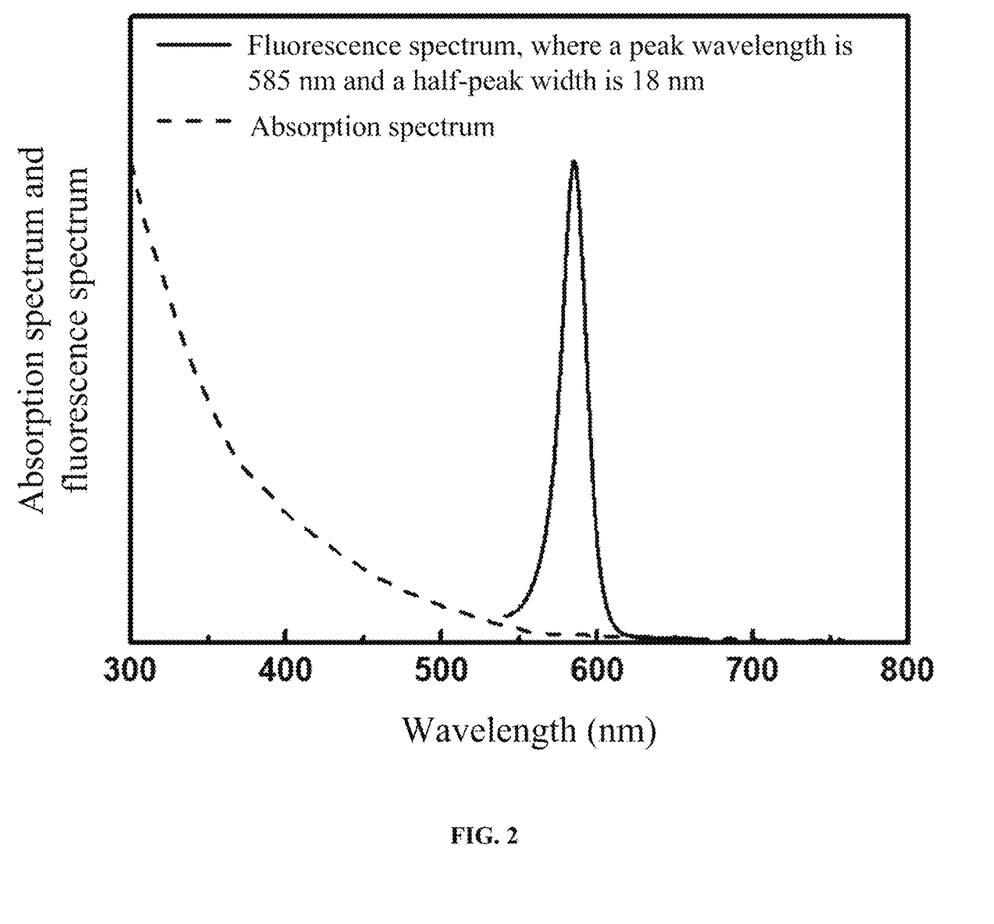
FIG. 2 shows an ultraviolet-visible absorption spectrum and photoluminescence spectrum diagram of a synthetic quantum dot in Example 2.

In this example, the core-shell structure quantum dots obtained were orange light quantum dots with narrow emission linewidth, narrow emission half-peak width and high color purity. FIG. 2 shows an absorption spectrum and emission spectrum of a core-shell structure quantum dot synthesized in this example. The narrowest half-peak width is 18 nm.

Example 3

1) Zinc acetate and oleic acid were mixed with a molar ratio of 1:2 at 200° C. until they were completely dissolved, and suction filtration was conducted to extract powder obtained after a solid phase product was dried. The powder was dissolved in 1-octadecene, which was a zinc precursor, with a molar concentration of 0.3 mol/L.

Cadmium oxide, 1-octadecene and oleic acid were mixed with a molar ratio of 1:10:4 at 200° C. until clarified to obtain a cadmium precursor.

Selenium powder was dissolved in 1-octadecene and tri-n-octylphosphine. The selenium powder, the 1-octadecene and the tri-n-octylphosphine had a molar ratio of 1:10:4, and the selenium precursor was obtained by ultrasonic vibration dissolution in a protective atmosphere.

In a glove box, sulfur powder was dissolved in 1-octadecene and tri-n-octylphosphine. The sulfur powder, the 1-octadecene and the tri-n-octylphosphine had a molar ratio of 1:10:4, and the sulfur precursor was obtained by ultrasonic vibration dissolution in a protective atmosphere.

2) A first amount of the zinc precursor, the cadmium precursor, oleic acid as an organic ligand and 1-octadecene as an organic solvent were injected into a first amount of the selenium precursor in a nitrogen atmosphere at 300° C. to induce a nucleation reaction and obtain a 1-octadecene solution with a cadmium selenide core. A molar ratio of the first amount of the zinc precursor measured by zinc acetate, the cadmium precursor measured by cadmium oxide, and the first amount of the selenium precursor measured by selenium powder was 16:2.5:1, and a molar ratio of cadmium ions in the oleic acid and the cadmium oxide was 6:1.

3) Coating was conducted with the zinc selenide layer (inner shell): a second amount of the selenium precursor was injected into a reaction device containing the 1-octadecene solution with a cadmium selenide core at 3 mL/h through an injection pump, and heat preservation was conducted for 30 min after injection. Coating was conducted with the zinc sulfide layer (outer shell): 3 mmol of a second amount of the zinc precursor (1-octadecene solution with a concentration of 0.3 M) was continued to be injected into the reaction device. A molar ratio of the second amount of the zinc precursor (measured by zinc acetate) to the inner shell selenium precursor (measured by selenium powder) was 1:1. After holding for 10 min, 1 mmol of the sulfur precursor was dropwise added at 3 mL/h. A molar ratio of the sulfur precursor (measured by sulfur powder) to the injected zinc precursor (measured by zinc acetate) of the outer shell was 3:1. Heat preservation was conducted for 30 min after injection. A molar ratio of selenium to zinc in the chemical composition of the zinc selenide layer was 1:1. A molar ratio of selenium to sulfur in the chemical composition of the zinc sulfide layer was 1:1. A molar ratio of the cadmium precursor in step 2) measured by cadmium oxide and the second amount of the selenium precursor in step 3) measured by selenium powder was 2:3.

4) After the quantum dot solution obtained in step 3) was cooled to 50° C., n-hexane and methanol with a volume ratio of 1:2 were added into the reaction system of quantum dot solution in step 3), stirred vigorously for 5 min, and subjected to still standing for 5 min for layering, and the methanol phase was sucked out. After the above operations were repeated for 5 times, argon was blown in to blow away the residual n-hexane and methanol. Finally, acetone was added. The precipitates obtained by centrifugation were the core-shell structure quantum dots.

Figure 3:
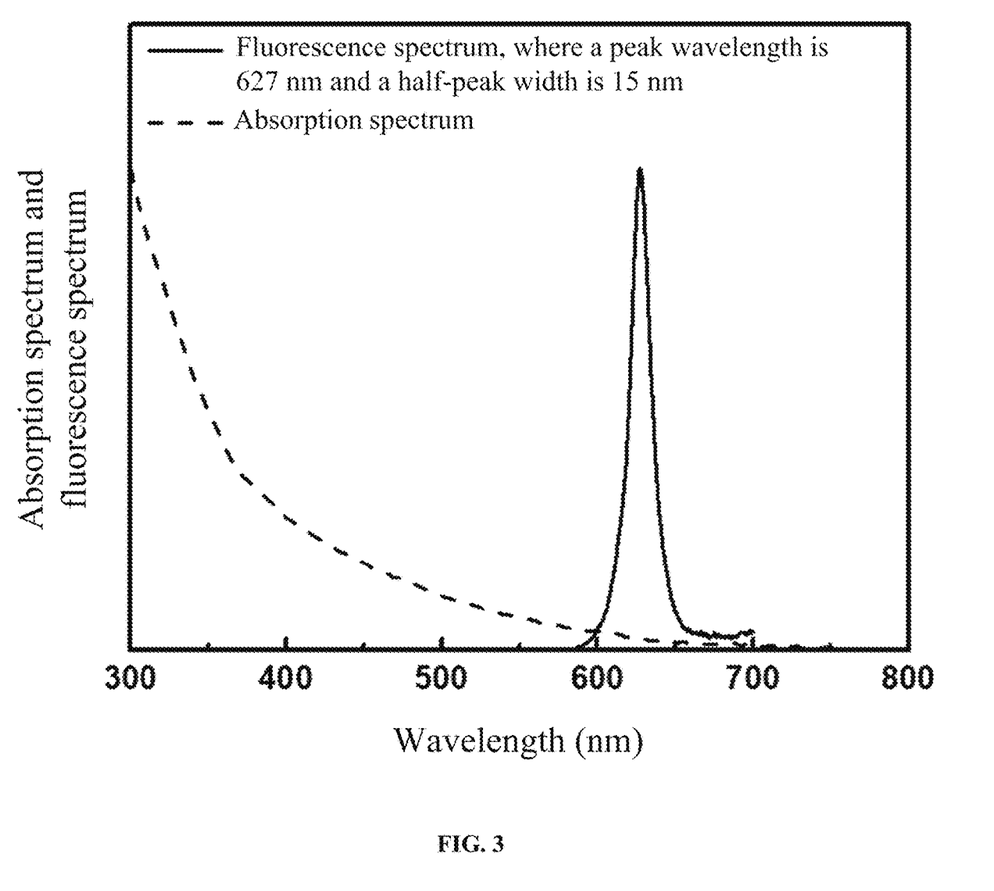
FIG. 3 shows an ultraviolet-visible absorption spectrum and photoluminescence spectrum diagram of a synthetic quantum dot in Example 3.
Figure 4:
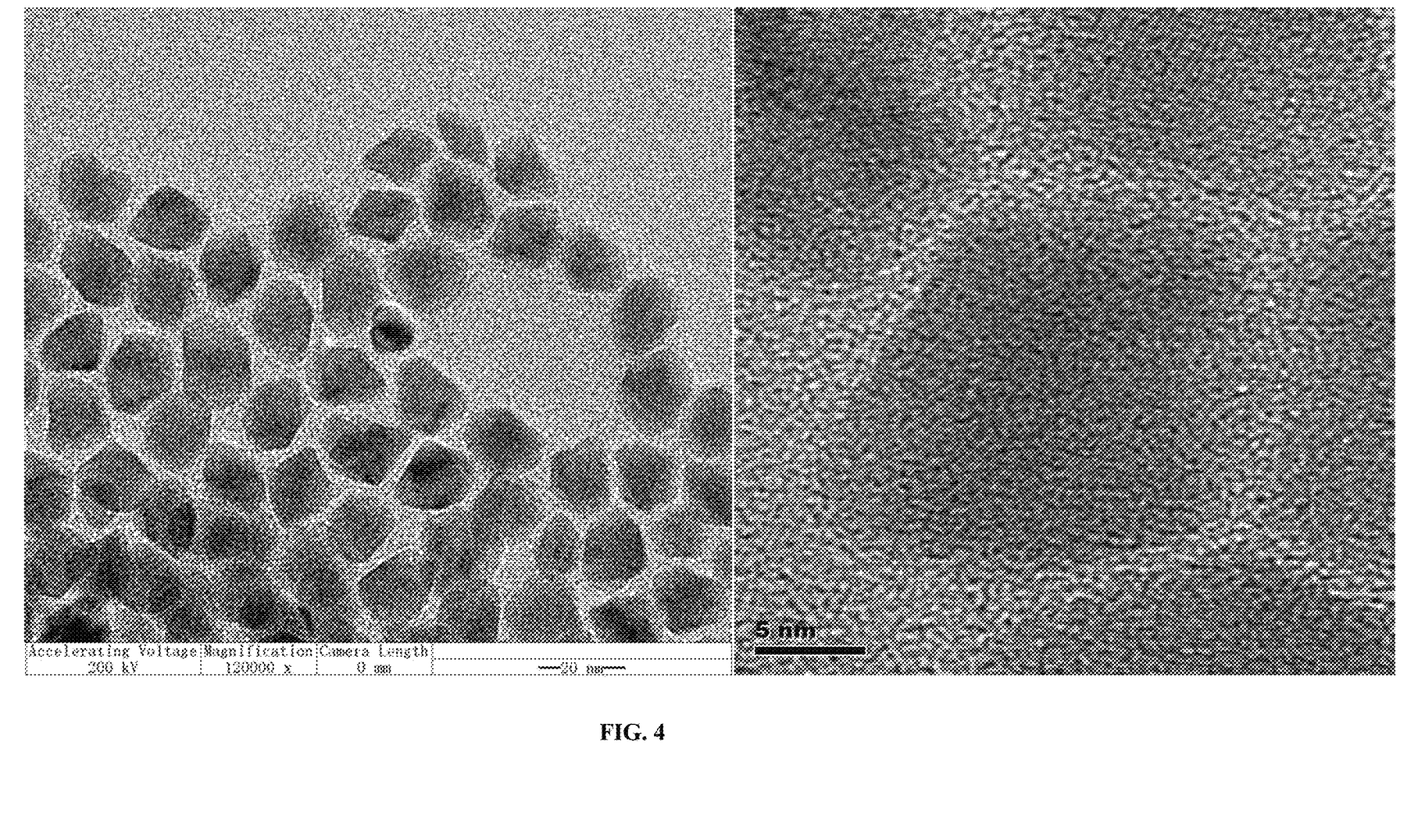
FIG. 4 shows a transmission electron microscope (TEM) image of the synthetic quantum dot in Example 3.

In this example, the core-shell structure quantum dots obtained were red light quantum dots with narrow emission linewidth, narrow emission half-peak width and high color purity. FIG. 3 shows an absorption spectrum and emission spectrum of a core-shell structure quantum dot synthesized in this example. The narrowest half-peak width is 15 nm. FIG. 4 shows a TEM image of the core-shell structure quantum dot synthesized in this example. It can be seen from FIG. 4 that the average size of the core-shell structure quantum dots prepared in this example is about 17 nm.

Although the present disclosure is described in detail in conjunction with the foregoing examples, they are only a part of, not all of, the examples of the present disclosure. Other examples can be obtained based on these examples without creative efforts, and all of these examples shall fall within the protection scope of the present disclosure.

What is claimed is:

1. A preparation method of a core-shell structure quantum dot, comprising the following steps:
1) completely dissolving zinc acetate in a first oleic acid solution with a molar ratio of 1:2 by mixing at 200° C., conducting suction filtration to extract a solid phase product and drying to obtain a powder, and dissolving the powder in a first 1-octadecene solution to obtain a zinc precursor with a molar concentration of 0.3 mol/L;
mixing cadmium oxide, a second 1-octadecene solution, and a second oleic acid solution with a molar ratio of 1:10:4 at 200° C. until a resulting mixture is clarified to obtain a cadmium precursor;
dissolving a selenium powder in a third 1-octadecene solution and tri-n-octylphosphine with a molar ratio of 1:10:4 to allow ultrasonic vibration dissolution in a protective atmosphere to obtain a selenium precursor; and dissolving a sulfur powder in a fourth 1-octadecene solution and the tri-n-octylphosphine with a molar ratio of 1:10:4 in a glove box to allow ultrasonic vibration dissolution in a protective atmosphere to obtain a sulfur precursor;

2) injecting a first amount of the zinc precursor, the cadmium precursor, a third oleic acid solution as an organic ligand, and a fifth 1-octadecene solution as an organic solvent into a first amount of the selenium precursor in a nitrogen atmosphere at 300° C. to induce a nucleation reaction and obtain a sixth 1-octadecene solution with a cadmium selenide core, wherein the first amount of the zinc precursor measured by the zinc acetate, the cadmium precursor measured by the cadmium oxide, and the first amount of the selenium precursor measured by the selenium powder are at a molar ratio of 16:2.5:1, and the oleic acid and cadmium ions in the cadmium oxide are at a molar ratio of 6:1;

3) coating an inner shell: injecting a second amount of the selenium precursor into a reactor containing the sixth 1-octadecene solution with the cadmium selenide core through a syringe pump at 3 mL/h, and then conducting heat preservation for 30 min; coating an outer shell layer: injecting 3 mmol of a second amount of the zinc precursor into the reactor, wherein the second amount of the zinc precursor measured by the zinc acetate and the second amount of the selenium precursor in the inner shell measured by the selenium powder are at a molar ratio of 1:1, conducting heat preservation for 10 min, adding 1 mmol of the sulfur precursor dropwise at 3 mL/h, wherein the sulfur precursor measured by the sulfur powder and a remaining zinc source after coating the inner shell measured by the zinc acetate are at a molar ratio of 3:1, and then conducting heat preservation for 30 min; wherein a selenium element and a zinc element in the inner shell are at a molar ratio of 1:1; a selenium element and a sulfur element in the outer shell are at a molar ratio of 1:1; and the cadmium precursor in step 2) measured by the cadmium oxide and the second amount of the selenium precursor in step 3) measured by the selenium powder are at a molar ratio of 2:3; and 4) cooling a quantum dot solution obtained in step 3) to 50° C., adding n-hexane and methanol with a volume ratio of 1:2 into a reaction system of the quantum dot solution in step 3), conducting a process of stirring vigorously for 5 min, layering by allowing to stand for 5 min, and removing a methanol phase, repeating five times, introducing argon to blow away residual n-hexane and methanol, and adding acetone and performing centrifugation to obtain a precipitate, namely the core-shell structure quantum dot; wherein the core-shell structure quantum dot emits red light with a high color purity, and has a low emission half-peak width of 15 nm and an average size of 17 nm.

* * * * *